(12) United States Patent
van den Berghe

(10) Patent No.: US 9,514,252 B2
(45) Date of Patent: Dec. 6, 2016

(54) METHOD, APPARATUS, AND PROGRAM FOR GENERATING A SIMULATION MODEL OF A SPACE

(71) Applicant: FUJITSU LIMITED, Kawasaki-shi, Kanagawa (JP)

(72) Inventor: Sven van den Berghe, Buckinghamshire (GB)

(73) Assignee: FUJITSU LIMITED, Kawasaki (JP)

( * ) Notice: Subject to any disclaimer, the term of this patent is extended or adjusted under 35 U.S.C. 154(b) by 92 days.

(21) Appl. No.: 14/536,766

(22) Filed: Nov. 10, 2014

(65) Prior Publication Data

US 2015/0142393 A1 May 21, 2015

Related U.S. Application Data

(63) Continuation of application No. PCT/EP2013/064898, filed on Jul. 15, 2013.

(30) Foreign Application Priority Data

Jul. 16, 2012 (EP) .................................. 12176609

(51) Int. Cl.
*G06G 7/48* (2006.01)
*G06F 17/50* (2006.01)
*G06F 3/0484* (2013.01)

(52) U.S. Cl.
CPC ........ *G06F 17/5004* (2013.01); *G06F 17/5009* (2013.01); *G06F 3/04842* (2013.01); *G06F 17/5018* (2013.01)

(58) Field of Classification Search
CPC .................................................. G06F 3/04842

(Continued)

(56) References Cited

U.S. PATENT DOCUMENTS

2007/0078635 A1 4/2007 Rasmussen et al.
2010/0092072 A1 4/2010 Guntur (Continued)

FOREIGN PATENT DOCUMENTS

WO     WO 2011/049889 A1     4/2011

OTHER PUBLICATIONS

Beitelmal et al., "Thermo-Fluids Provisioning of a High Performance High Density Data Center", *Distributed and Parallel Databases*, 2007, pp. 227-238, vol. 21.

(Continued)

*Primary Examiner* — Hugh Jones
(74) *Attorney, Agent, or Firm* — Staas & Halsey LLP

(57) ABSTRACT

Embodiments of the present invention include a method of generating a simulation model of a space, the simulation model being a three-dimensional geometrical representation of the space in a format appropriate for computational fluid dynamic analysis; the method comprising: obtaining a geometrical representation of the space; obtaining a characterization of the operation and/or arrangement of physical entities influencing airflow in the space, from among a predetermined set of characterizations; generating the simulation model of the space based on the geometrical representation, wherein said generating includes: configuring the simulation model by selecting configuration options, from those associated with the obtained characterization in a database in which each of the predetermined set of characterizations are codified as a set of configuration options for a simulation model, in dependence upon the content of the geometrical representation.

13 Claims, 8 Drawing Sheets

(58) Field of Classification Search
USPC .............................................................. 703/6
See application file for complete search history.

(56) References Cited

U.S. PATENT DOCUMENTS

2011/0060571 A1 3/2011 Ueda et al.
2012/0071992 A1 3/2012 VanGilder et al.

OTHER PUBLICATIONS

Extended European Search Report mailed Dec. 21, 2012, in corresponding European Patent Application No. 12176609.1, 7 pp.
International Search Report mailed Feb. 12, 2014, in corresponding International Patent Application No. PCT/EP2013/064898, 11 pp.

METHOD, APPARATUS, AND PROGRAM FOR GENERATING A SIMULATION MODEL OF A SPACE

CROSS-REFERENCE TO RELATED APPLICATION(S)

This application is a continuation of and claims the benefit of International Application No. PCT/EP2013/064898, filed Jul. 15, 2013, which claims the foreign priority benefit of European Application No. 12176609.1, filed Jul. 16, 2012, the disclosures of which are incorporated herein by reference.

BACKGROUND OF THE INVENTION

1. Field of the Invention

This invention is in the field of computational fluid dynamic analysis, and relates in particular to the generation of models for use in such analysis.

2. Description of the Related Art

Reducing the energy used by data centers is becoming commercially and socially important. A significant part of the energy used by current data centers is used to cool the data center. The main mechanism of cooling data center equipment is by the flow of air and understanding and carefully controlling the movement of air can increase the efficiency of the cooling process. Effective air-flow management ensures that cooled air is directed at parts of the data center that need cooling and not re-circulated without doing any cooling, it also ensures that warm air is quickly moved to the cooling equipment.

Increasing density of IT equipment (generating more heat in the same floor space) also increases the need for effective control of airflow.

It is desirable to control airflow throughout the life cycle of the data center; not only during design, but also as the data center evolves with increasing loads and with reconfigurations of the equipment.

Computerised simulations of airflow in a space enable solutions to optimisation problems to be found so that adjustable factors such as temperature setpoints, fan speeds, workload allocation, and operating states of cooling equipment can be set in a manner that provides the best level of energy efficiency achievable, given certain boundary conditions. Simulation models for use in simulations must be in particular formats and include a certain level of detail on particular features and aspects of the space (including the equipment in the space).

SUMMARY OF THE INVENTION

Embodiments of an aspect of the present invention include a method of generating a simulation model of a space, the simulation model being a three-dimensional geometrical representation of the space in a format appropriate for computational fluid dynamic analysis; the method comprising: obtaining a geometrical representation of the space; obtaining a characterization of the operation and/or arrangement of physical entities influencing airflow in the space, from among a predetermined set of characterizations; generating the simulation model of the space based on the geometrical representation, wherein said generating includes: configuring the simulation model by selecting configuration options, from those associated with the obtained characterization in a database in which each of the predetermined set of characterizations are codified as a set of potential configuration options for a simulation model, in dependence upon the content of the geometrical representation.

Advantageously, in embodiments of the present invention, the database enables features or changes to features of a representation of a space made at a geometrical representation level to be translated into consequences for a simulation model. Therefore, the simulation can be modified or generated without requiring expertise in or knowledge of how to configure a simulation model itself, because the configuration options are stored in a database and selected based on the geometrical representation and the characterization. Hence, a user can provide a characterization of the operation and/or arrangement of physical entities influencing airflow in a space, and a geometrical representation of the space, and a simulation model, appropriately configured and formatted, is generated from that information.

CFD simulations are an important tool for understanding the flow of air in a space and for developing the most effective airflow management techniques. CFD models start from a representation of the geometry of the data center halls: the shape of the room, the shape and location of equipment, the speed of air moved by any fans, the heat added and extracted, where air enters and leaves etc. This may be derived from plans and on-site surveys of the actual space. Using existing techniques, the creation of simulation models is a manual and time-consuming process performed by experts in creating CFD models.

CFD simulations should be run throughout the lifetime of a space such as a data center, particularly when significant changes have been made to the data center (such as changes to the equipment configurations or increases to the IT load).

With current computer capabilities, the main cost of performing CFD simulations is not the processing cost of running the simulations, but the cost of creating and maintaining the simulation model. While modern CFD packages can execute simulations without expert supervision and nonexperts can interpret their results, the initial creation of the simulation model is still a task for experts on CFD.

Embodiments of the present invention enable CFD simulations of data centers to become a tool in routine use, by automating elements of the creation and maintenance of simulation models—reducing or eliminating the need for experts. The automation is achieved by querying a database which associates each of a predetermined set of characterizations of the operation and/or arrangement of physical entities influencing airflow in the space with a number of configuration options—which may be viewed as 'consequences' for the simulation model if certain conditions are met—wherein the conditions may be properties, measurements, or values derivable from the geometric representation of the space. To that end, the configuration options may each be stored with logic for deciding under what conditions the configuration should be implemented on the simulation model (in the generation of the simulation model), and additional logic for determining the form which that implementation should take.

Exemplary configuration options include elements to include in the simulation model, and the form and/or position of the elements is determined by the content of the geometrical representation. It may be that it is possible to derive, based on the characterization, a set of elements which should be included in the simulation model of the space. For example, the elements may be physical entities. If a characterization is that cooled air is provided by a system of CRAG units, then the configuration option may be the addition/inclusion of a CRAG unit to/in the simulation model. The configuration option may be stored with logic determining how/where/in what form the physical entity should be modelled. Best-practice guidelines and other industry standard knowledge can be codified in the database to improve the accuracy with which the simulation model is generated, based on the assumption that best-practice guidelines and industry standard techniques have been implemented in the design of the space itself. For example, it may be that best-practice guidelines for the number of CRAG units per server rack or per unit area of floor space are codified into the database, so that a characterization of the space as having cooled air supplied by CRAG units, can be used, in conjunction with an assessment of the floor space or number of server racks derived from the geometrical representation, to arrive at a selection of a number of CRAG units to include in the simulation model.

In a similar fashion, the configuration options may include logic to apply to decide whether or not certain features/contents of the geometrical representation should be interpreted in a certain way. That is to say, the configuration options may include interpretations of content of the geometrical representation, and selecting configuration options includes selecting an interpretation of content of the geometrical representation based on the shape and position of said content. For example, a characterization of the physical arrangement of physical entities may be that servers are arranged in "aisles". Hence, the configuration option may be whether or not/how many aisles of server racks to include in the simulation model, and the selection from among those configuration options made by assessing how many extended lines of apparatus in the geometrical representation can be assumed to be aisles of server racks. The configuration options may be stored with logic for making such an assessment. Of course, were the space to have been characterised differently, it may be that a different configuration option giving a different interpretation of the same features of the geometrical representation would have been selected.

The number of different possible interpretations of the geometrical representation, and the extent to which the selection of configuration options is based upon assumptions about the space will depend on the level of detail in the geometrical representation. For example, the geometrical representation may contain indications of what each physical feature included in the plan is, for example, a server rack/a semi-permeable floor tile, a CRAG unit, a clear space etc, hence the transformation from geometrical representation to simulation model may be made without referring to the database to identify/interpret/place that particular feature. Of course, it may still be that various operating details are selected from among a number of configuration options stored in the database based upon a characterization of the operation of the feature in question.

The storage of configuration options in a database, which configuration options are stored with data required to implement the configuration option on a simulation model, enable detail to be added to be added to the simulation model in a format required for the simulation model without a user or data center operator necessarily having knowledge of the detail or how to implement it on a simulation model. The database is a codification of working practices that enable characterizations of the operation and/or physical arrangement of physical entities in a space to be associated with certain configuration options for configuring a simulation model of the space. The codification of working practices also enables the derivation of logic, which logic may also be stored in the database, for using analysis of a geometrical representation of the space to select how to configure the simulation model from among the configuration options associated with a particular characterization. To that extent, the configuration options may be assumptions, presumptions, and/or inferences about the space made in order to obtain a representation of the space in sufficient detail for the simulation model to be generated in the appropriate format, based on the geometrical representation.

The selection of configuration options therefore may have two stages, which do not necessarily take place in a set order. The stages including using a characterization of the space to inform the selection of configuration options used in configuring/generating the simulation model, and using the geometrical representation of the space (or analysis thereof) to inform the selection of configuration options used in configuring/generating the simulation model. Therefore, the characterization may be considered to be a description/summary/indication/aggregation/observation of an aspect of the space which enables detail to be added to the simulation model which is not directly derivable from the geometric representation based on assumptions about the geometric representation codified in the database. Examples of characterizations are indications or descriptions of one or more of the following aspects of the space:

the layout of equipment in the space;
the positioning of cooling equipment;
the operating principle of types of equipment in the space;
an airflow management strategy; and
a heat exchange mechanism employed by cooling equipment.

The geometrical representation may take any of a number of forms. For example, it may be a plan of the space which is scanned in to a computer for analysis, which analysis may include or lead to the selection of configuration options from the database. The geometrical representation may be a CAD model representing the physical arrangement of apparatus in the space, but lacking operational information. The geometrical representation may be three-dimensional, but may also be two-dimensional. Technology already exists for converting two-dimensional representations to three-dimensional ones. Embodiments of the present invention extend such technology by accessing the database which uses characterizations of the space to make assumptions and hence selections from a number of configuration options in order to configure the simulation model.

CFD simulations are a valuable mechanism for optimising the efficiency of cooling operations in a space not only at an initial setup stage, but on an ongoing basis. It may be that an embodiment of the present invention, or other method, is used to establish a simulation model of a particular space, and that simulation model used to find optimal settings for certain of the apparatus in the space, for example, placement of entrances/exits for cooled/hot air, workload placement, CRAG units on/off, fan speeds, temperature setpoints etc. However, changes to the space, for example, replacement of a certain piece of equipment with a new model, changes to the distribution of workload, or other alterations, may influence the airflow in the space, which could result in a reduction in the efficiency of the cooling equipment, and could even lead to a reduction in effectiveness of the cooling equipment to the extent that various apparatus is in danger of overheating. Therefore it may be desirable to update the simulation model and carry out further simulations and analysis. Hence, the geometrical representation may be an existing three-dimensional geometrical representation of the space in a format appropriate for computational fluid dynamic analysis.

Of course, because the database codifies standard industry working practices to enable assumptions about the space (and specifically about the arrangement and operation of physical entities influencing airflow in the space) to be made, it follows that there may be instances in which the assumptions, though helpful insofar as adding detail to a level required by the simulation model, do not add the detail in a manner which is accurate, or sufficiently accurate for simulation modelling needs. Therefore, it may be that some further input, for example user input, is required in order to improve the accuracy of the simulation model. Optionally, the generating further includes, following the configuring, a manipulation process including:

outputting an intermediate representation of the space implementing the selected configuration options in a form in which manipulations can be registered;

obtaining registered manipulations; and modifying the intermediate representation of the space in accordance with the registered manipulations. In such embodiments, the configuration options used in configuring the simulation model are first implemented in the generation of the intermediate representation of the space. For example, it may be that the geometric representation and the selected configuration options are used to generate a three-dimensional object-oriented representation of the space; and the method further comprises converting the three-dimensional object-oriented representation of the space into the simulation model. Advantageously, the three-dimensional object-oriented representation of the space can be employed as the intermediate representation for use in the manipulation step. Such representations, for example CAD models, can be manipulated and modified in order to set how certain physical entities and their operation will be represented in the simulation model.

Embodiments of the present invention include dedicated hardware devices, programs, and methods, which may be computer-implemented methods. In a computer-implemented method, the functionality of existing computer hardware such as I/O devices, processor, memory, storage, and network interface card, among others, may be used in performing a method embodying the invention. A user of the computer on which the method is implemented may select and input a geometrical representation, for example, by selecting a computer file storing a geometrical representation from a number of stored files, or by scanning in plans and design documents or even photographs from documentary format to obtain computerised geometrical representations of the space. In computer-implemented methods embodying the present invention, one or more of obtaining the characterization, obtaining the geometrical representation, and obtaining registered manipulations, may be obtained by receiving indications of inputs from a user of a computer on which the method is implemented or of a computer connected to a computer on which the method is implemented.

In certain implementations embodying the present invention, it may be that the geometrical representation includes or is provided along with operating information of physical entities influencing airflow within the space. Some operating information may be inferred with reference to the database, however, some operating information may be stored on plan drawings, or in computerised files also including plan drawings. Alternatively, certain implementations of invention embodiments may prompt a user directly for operating information. Examples of operating information include load levels of server equipment, how full a server rack is, fan speeds, temperature set points, and possibly also whether certain channels or entrance/exits for airflow are open/closed/partially open.

In embodiments of another aspect of the present invention, there is provided a simulation model generation apparatus for generating a simulation model of a space, the simulation model being a three-dimensional geometrical representation of the space in a format appropriate for computational fluid dynamic analysis; the simulation model generator comprising: a geometrical representation acquisition unit operable to obtain a geometrical representation of the space; a characterization acquisition unit operable to obtain a characterization of the operation and/or arrangement of physical entities influencing airflow in the space, from among a predetermined set of characterizations; a generator operable to generate the simulation model of the space based on the geometrical representation, wherein said generator includes: a configuration unit operable to configure the simulation model by selecting configuration options, from those associated with the obtained characterization in a database in which each of the predetermined set of characterizations are codified as a set of potential configuration options for a simulation model, in dependence upon the content of the geometrical representation.

Embodiments of another aspect of the present invention provide a simulation model generation program which, when executed by a computer, causes the computer to perform a method embodying the present invention.

Embodiments of another aspect of the present invention provide a system for generating a simulation model of a space, the system comprising: a computer configured to perform a method embodying the present invention; and a data storage unit storing the database employed in methods embodying the present invention.

BRIEF DESCRIPTION OF THE DRAWINGS

Preferred features of the present invention will now be described, purely by way of example, with reference to the accompanying drawings, in which.

DETAILED DESCRIPTION OF THE PREFERRED EMBODIMENTS

Figure 1:
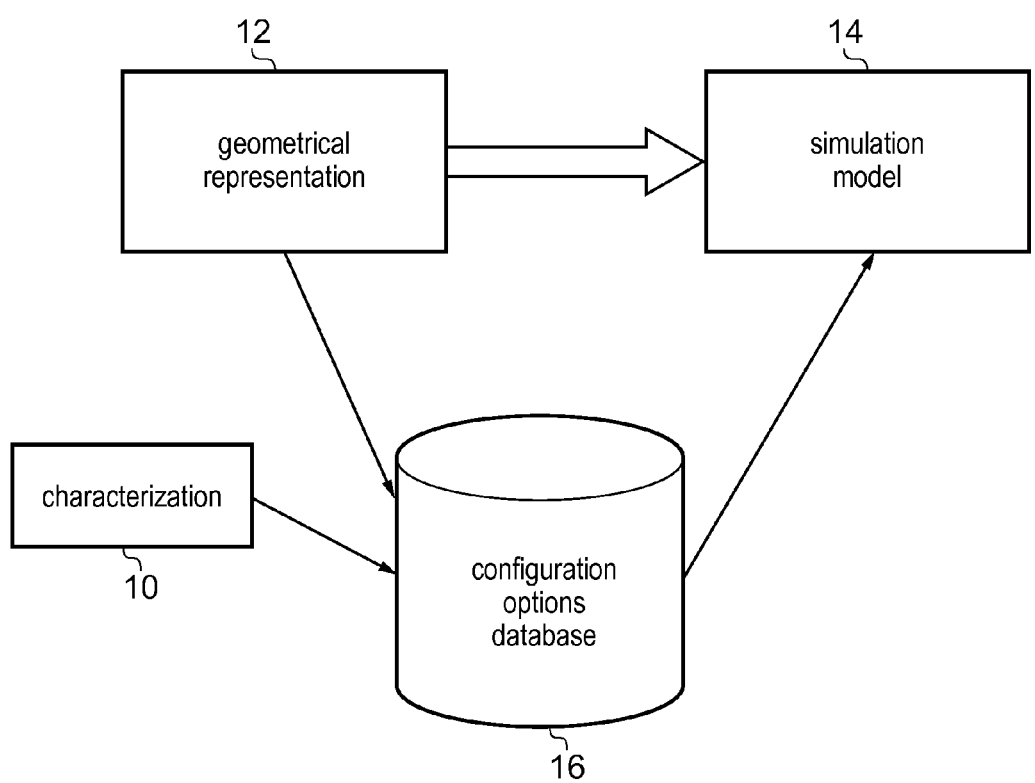
FIG. 1 is a schematic representation of a process embodying the present invention.

FIG. 1 is a schematic representation of a process embodying the present invention. The geometrical representation of a space 12 is obtained along with a characterization of the operation and/or arrangement of physical entities influencing airflow in the space 10 (which may be shortened to "characterization" elsewhere in this document for the sake of convenience to the reader). The characterization 10 may be one of a predetermined set of characterizations. For example, it may be obtained as responses to a series of closed questions. The simulation model 14 is the outcome of the process, and is a three-dimensional geometrical representation of the space in a format appropriate for computational fluid dynamic (CFD) analysis. The thick arrow between the geometrical representation 12 and the simulation model 14 represents the process of generating the simulation model 14 based on the geometrical representation 12. The precise nature of the processing required in said generating will depend on the specific implementation. The geometrical representation 12 itself may take many forms, for example, it may be 2-D or 3-D, and it may be of a particular format. The precise nature of processes for generating simulation models is the subject of much innovation and research and a skilled person working in this field will be aware of programs/tools/mechanisms for generating simulation models based on geometrical representations. An innovation of embodiments of the present invention is the inclusion of a 'configuring' step within the generating. The configuring step includes configuring the simulation model 14 by selecting configuration options from those associated with the obtained characterization in a database 16 ("configuration options database") in which each of the predetermined set of characterizations are codified as a set of potential configuration options for a simulation model, the selecting being done in dependence upon the content of the geometrical representation. The configuring step is represented on FIG. 1 by the arrows running from each of the characterization 10 and the geometrical representation 12 to the configuration options database 16, and by the arrow running from the configuration options database 16 to the simulation model 14.

The simulation model 14 generated in the process is in a format appropriate for CFD analysis. That may mean that it is formatted in a computer file format required for a CFD analysis program. Conceptually, such a format may be represented as a 3-D mesh of grid points, which is supplemented with indications of airflow speeds and directions. The simulation model may comprise information including the location of the grid points, and each grid point may also have some properties attached to it. These are stored as additional properties. The properties may include:

permeability—including where airflow is completely blocked by the edges of the space (walls, equipment etc) and where airflow is restricted (e.g. by perforated floor tiles);

air speed and direction imposed by things not simulated, such as fans in CRACs blowing air into the data center hall; and/or air temperature imposed by things not simulated, such as heating from the IT equipment, cooled air from CRACs.

Some of the properties may be available before the simulation (eg. permeability) and some, such as air speed, direction, and temperature, will be computed by the simulation.

Once a simulation model 14 is generated, one or more CFD simulations of airflow within the space can be performed. CFD simulations are an important tool in optimising the energy efficiency of cooling systems in a space, for example, by finding optimum settings for adjustable settings such as fan speeds, workload placement, and/or temperature setpoints.

The space modeled in the simulation model may be, for example, an enclosure such as a data center room. The boundaries of the space may be the boundaries of the room, although it may be that the model includes ducting or plenums which may be considered exterior to the enclosure. The space is taken to include physical entities within the boundaries of the space, so that the simulation model includes simulation model elements such as representations of server equipments, cooling equipment, barriers to airflow (permeable/non-permeable), airflow containment structures, fans, heat exchangers, equipment mounting structures such as racks, amongst other types of equipment.

The geometrical representation of the space 12 may be one or more documents such as a building plan, a diagram of the space and the equipment therein, and may be accompanied by additional information such as inventories of equipment and their dimensions and other properties. Alternatively or additionally, the geometrical representation 12 may be a file format recognised as a file format for geometrical representation of a space and from which geometrical properties of the space can be extracted for generating the simulation model 14. The geometrical representation of the space 12 may be an existing simulation model such as a three-dimensional geometrical representation of the space in a format appropriate for computational fluid dynamic analysis, and the purpose of the generating a simulation model 14 is as an updated representation of the space, for example, to reflect a change in arrangement of equipment or operating conditions of equipment.

A characterization may be one or a series of pieces of information which describe the arrangement of physical entities influencing airflow in the space, or which describe the operation of those physical entities. The physical entities may include, for example, boundaries such as walls, floors, ceilings, and/or equipment including cooling equipment, server equipment, airflow confinement apparatus, heat exchangers, structures on which other equipment is mounted, fans, air conditioning units such as CRAG units. The physical entities may influence the flow of air in the space by containment, heat exchange, and/or propelling/moving air by contact with moving parts. Characterization of the operation of physical entities may be an indication of airflow containment policies, air cooling policies, workload placement policies, airflow control policies, and so on. Characterizations are pieces of information from which configuration details such as specific properties and details of the simulation model can be inferred based on the geometrical representation and with reference to the configuration options database. The predetermined list of characterizations may be stored in a database. It may be that the characterization 10 includes a series of descriptions of different aspects of the arrangement and/or operation of physical entities influencing airflow in the space. The description of each aspect may be selected from a list, for example, the selection may be made by a user of a computer implementing a method embodying the present invention. The selection from a list may not be a straightforward presentation and selection, but may include narrowing from a range of possible characterizations by a series of questions or prompts.

The nature of the process of obtaining the geometrical representation 12 and the characterization 10 will depend on the specific implementation of the invention embodiment. For example, in a computer-implemented method embodying the present invention, it may be that the obtaining includes receiving inputs from a user of the computer, possibly also including prompting the user for inputs. Such prompting may be informed by previous inputs. The obtaining may also include receiving inputs from another machine, again, which may include prompting.

As mentioned above, the precise nature of the generating will depend on the implementation of the invention embodiment, and will, of course, depend on the nature of the obtained geometrical representation 12. The precise nature of the processing required for the generating is outside of the scope of this document, but may include processing to convert a 2-D geometrical representation of the space into a 3-D geometrical representation of the space, such as an object-oriented CAD model, and further processing to convert the CAD model into a simulation model 14, such as a 3-D mesh of points. In embodiments of the present invention, the process of generating the simulation model of the space 14 based on the geometrical representation 12 includes configuring the simulation model by selecting configuration options, from those associated with the obtained characterization in a database in which each of the predetermined set of characterizations are codified as a set of potential configuration options for a simulation model, in dependence upon the content of the geometrical representation.

Configuring the simulation model 14 may include, for example, interpreting a feature of the geometrical representation 12 in a certain way based on the characterization 10. In that example, the configuration option may be logic stored so that if an object or feature in the geometrical representation meets certain criteria, properties of the object or feature will be inferred, such as one or more of type, size, shape, heat generation statistics, permeability. Furthermore, it may be that some properties of the object or feature are inferred from logic stored in the database and properties stored in the database, and some are then obtained by reference to a further database storing device-specific information, perhaps with reference to an inventory list or some other information.

Configuring the simulation model may also include inferring the presence of certain types of elements in the simulation model 14 based on the characterization 10. For example, it may be that a characterization of an aspect such as air distribution mechanism is "under-floor plenum". Thus, the configuration option would be the option to add an under-floor plenum to the simulation model 14, and again it could be based on logic stored in the database such as "if an under-floor plenum is not detected in the geometrical representation, then add an underfloor plenum in the generating". Of course, the precise form of elements included in (by addition or by interpretation) the simulation model 14 will to an extent be dictated by features and properties derived from the geometrical representation 12.

As described above in relation to configuration options including interpreting geometrical representation objects in a certain way and adding new elements to the simulation model, the configuration options are assumptions/presumptions/inferences about the space made in order to obtain a representation of the space in sufficient detail for a simulation model 14 to be generated in the appropriate format. The configuration options are stored in the database 16, and may be maintained centrally, so that many implementations of invention embodiments access a single database or data store. The database 16 may associate configuration options with characterizations based on knowledge acquired from, for example, industry codification documents/knowledge such as best practices, maturity models, qualitative characterizations, and the logic applied in selecting configuration options associated with the characterization 10 based on the geometrical representation 12 may be derived/programmed/written based on the same acquired knowledge. The configuration options are 'options' insofar as some logic (which may be stored in the database with the configuration option) is applied decide whether or not, and possibly also how and in what form, the option should be implemented on the simulation model, that is to say, precisely how to configure the simulation model. It may be that some analysis of the geometrical representation is performed in order to decide in what form the option should be implemented.

Figure 2:
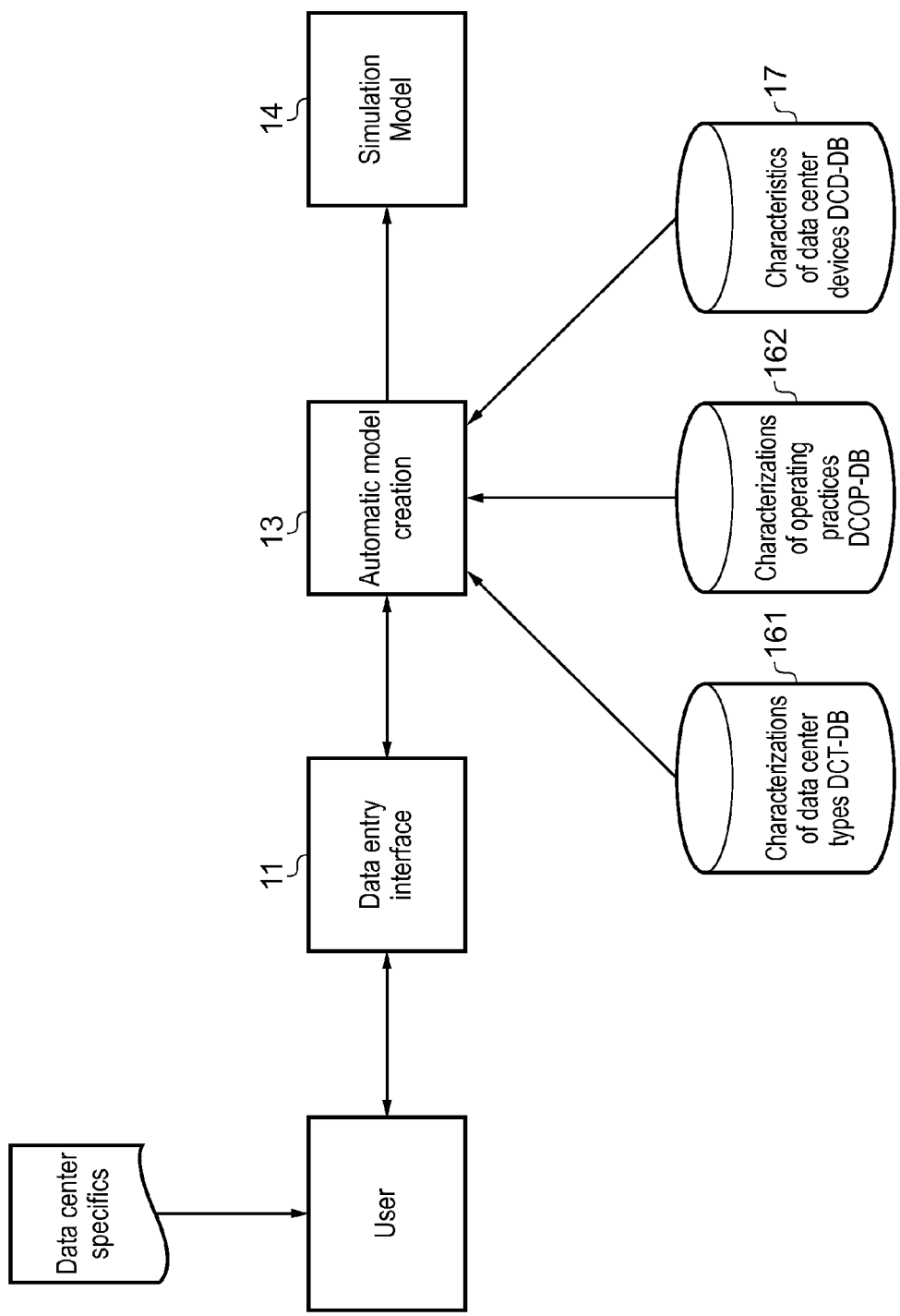
FIG. 2 is an alternative representation of a process embodying the present invention.

FIG. 2 is an alternative representation of a process embodying the present invention. The data center specifics are knowledge held by or accessible to the user, which may be the data center operator, but which knowledge is not suitable for direct implementation in a simulation model (CFD model), and that cannot be converted to a format for direct implementation in the simulation model without expertise in simulation modelling. The space being modelled in the example of FIG. 2 is a "data center", which is a facility used to provide computer systems and possibly also associated components, such as data storage systems, to client/remote computers or networks.

The user is a human operative of a computer implementing a method embodying the present invention or of some other hardware or process embodying the present invention. The user acts as a source of data center-specific information to the process of generating a simulation model 14. The information provided includes a characterization 10 and a geometrical representation 12. As illustrated in FIG. 2, a data entry interface 11 is provided by which the information is input to the process of creating the simulation model. The flow of information between the data entry interface 11 and the user is two-way. This is representative of the fact that the user may be prompted for more information by the data entry interface 11 on the basis of earlier input information. For example, a characterization 10 may be initially quite general, and that may give rise to a number of prompts for more specific characterizations by the data entry interface 11. The data entry interface 11 may be connectable to a database from which the information prompts are provided, along with logic determining which prompts should be presented next to the user.

The automatic model creation process 13 is the process by which the geometrical representation and characterization are used to query the database 16 in order to configure the simulation model to include sufficient detail for CFD simulations and to represent the space, possibly with assumptions or inferences made based on industry-standard practices codified into the database. The automatic model creation process 13 is an example of the process of FIG. 1, in which the characterization 10 and geometrical representation 12 are provided via the data entry interface 11. Thus, a description of the automatic model creation process 13 can be found with reference to the above description relating to FIG. 1. Furthermore, a more detailed specific example of the automatic model creation process is provided below with reference to FIG. 3. In the specific example of FIG. 2, the configuration options database 16 is split up into two constituent parts: the characterizations of data center types database (DCT-DB) 161, and the characterizations of operating practices database (DCOP-DB) 162. The DCT-DB 161 associates configuration options relating to the physical arrangement and identification of physical entities influencing airflow in the space with characterizations of the physical arrangement of physical entities influencing airflow in the space. The DCT-DB 161 also stores logic for selecting which configuration options to implement, for example based on analysis of the geometrical representation 12, and implementation instructions for the automatic model creation process 13. The DCOP-DB 162 associates configuration options relating to the operation of physical entities influencing airflow in the space with characterizations of the operation of physical entities influencing airflow in the space. The DCOP-DB 162 also stores logic for selecting which configuration options to implement, for example based on analysis of the geometrical representation 12, and implementation instructions for the automatic model creation process 13.

The DCT-DB 161 characterizes the types of data center and the technologies employed. It encapsulates the knowledge of data center design and operating principles known to the operators and allows translation of these concepts into the data center simulation model. As such, it can be implemented as an ontology. Using ontologies also allows reasoning of consequences of information provided by the user e.g. that existence of a ceiling void for hot air implies that CRAG models should be selected only from those that support return air from ceiling ducting.

The DCOP-DB codifies operating practices, bridging the knowledge of the operators with the simulation model, and so may also be implemented as an ontology.

In addition, a characterization of data center devices database (DCD-DB) 17 is provided. The DCD-DB 17 associates specific details of devices with indications of a characterization of the device such as a model number, manufacturer, or other description. The DCD-DB 17 enables detail to be added to the simulation model 14 which may not otherwise be known by the user.

The DCD-DB contains information about the physical characteristics of the devices, dimensions and operating characteristics. One implementation could be a could be a SQL database, however this may lead to duplication of data throughput the enterprise and so it may also contain interfaces to Data Center Information Management Systems (DCIM) already installed.

The product of the automatic model creation process 13 is the simulation model 14, which is formatted for use as a CFD model, and may be, for example, a representation of a 3-D mesh of grid points.

Figure 3:
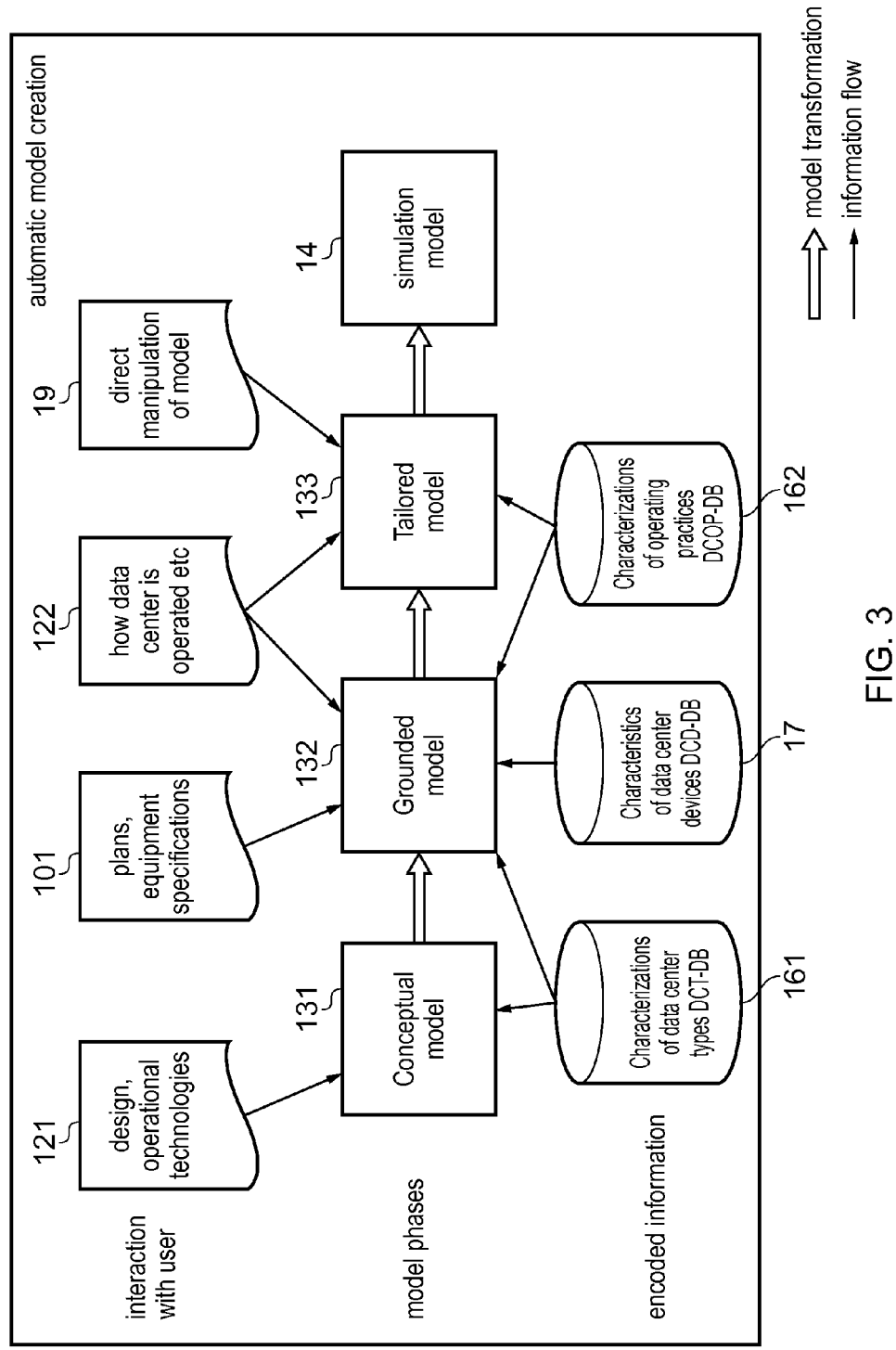
FIG. 3 is a detailed representation of an exemplary process of generating a simulation model in embodiments of the present invention.

FIG. 3 is a detailed representation of an exemplary process of generating a simulation model in embodiments of the present invention. The automatic model creation process of FIG. 3 is an example of the process of generating a simulation model of a space. In the example of FIG. 3, the space is a data center room or data center hall.

In FIG. 3, there are three layers. A first layer "interaction with a user", illustrates stages of the process at which information provided by the user is employed to guide, inform, or shape the process. In that sense, the process is not fully automated, but includes automated aspects or steps. The model phases layer illustrates the result obtained by combining the information provided by the user with the encoded information at each stage of the process. The encoded information layer illustrates the information which provides the additional detail to the process required for producing a simulation model of sufficient detail and in a format appropriate for CFD simulations.

The encoded information is held in a number of databases, the DCT-DB 161, the DCD-DB 17, and the DCD-OP DB 162. The databases may be held centrally so that they are accessible to a number of instances of embodiments of the present invention. For example, they may be curated by overall system managers having specialist knowledge in the area of CFD model generation and able to encode information into a database for use in modelling a plurality of different spaces, each of which may be managed by an operator having knowledge of the space, but not of CFD model generation techniques.

Characterizations of a space may be provided by a user in terms with which they are familiar, but which terms cannot be used directly for configuring a simulation model. Hence those terms are codified in the databases into configuration options which may be implemented in the process of generating a simulation model. In order to take a term (characterization) and use that term for configuring a simulation model, it may be that a number of inferences and assumptions about the space have to be made, based on the characterization and possibly also geometrical representations of the space such as plans and other information.

The databases may codify information gathered from a variety of sources, including best practice guidelines, maturity model descriptions, and qualitative characterizations.

Codifications contain concepts that can be mapped onto details derived from the geometrical representation in order to generate the simulation model 14. This means that an automatic process for generating CFD meshes can be guided by the codifications which in turn means that the process can be understood and controlled by the data center operators and an expert in CFD is not necessary.

Best Practices guidelines include recommendations for the best way to operate a data center. They may contain lengthy procedures, but these are summarised in phrases that are well defined in the documents and understood across the industry e.g. "Raised floor air flow management" is associated with the following inferences: "Close all unwanted apertures in the raised floor. Review placement and opening factors of vented tiles. Maintain unbroken rows of cabinets to prevent bypass air—where necessary fill with empty fully blanked racks. Managing unbroken rows is especially important in hot and cold aisle environments. Any opening between the aisles will degrade the separation of hot and cold air." An example Best Practices document is the "EU Code of Conduct on Data Centers v2.0." Such information can be codified into the DCT-DB 161 so that a characterization of the space as implementing raised floor air flow management will lead to the simulation being configured in accordance with the above-listed inferences about the space.

Maturity models describe the "maturity" of a data center design or its operation in terms of characterizations e.g. levels of redundancy. An example of these is the data center classification through tier models from, for example, the Uptime Institute. Such information can be encoded in the DCOP-DB 162 so that a characterization of the redundancy level of the data center (space) is associated with operation details for a number of physical entities in the data center.

In a more general sense, the DCOP-DB 162 codifies operating practices that can be used to set boundary conditions for the simulation model. Important processes codified in the DCOP-DB 162 are the control of air leakage and how the temperature and airflow are controlled within the space (where, if at all, a set temperature is maintained, how fans respond to load etc).

Qualitative characterizations are descriptions of classes of design of data centers or their components in general terms that are aimed at enabling discussion of the merits of the various classes. An example is "QUALITATIVE ANALYSIS OF COOLING ARCHITECTURES FOR DATA CENTERS" from The Green Grid. Such information may be encoded as assumptions that can be made about the operating practices or arrangement of physical entities in a space, and hence may be encoded in the DCOP-DB 162 or the DCT-DB 161.

In a more general sense, the DCT-DB 161 codifies information about data center types: how data centers are put together and arranged, in particular where the air flows in standardised configurations. For each data center type it contains collections of attributes that need to be extracted from information supplied by the user (answers to questions, plans/geometrical representations etc) and filled in with actual locations and dimensions. Examples of this type of information include configuration options such as if there should be an under floor void, if there are regular rows of IT devices, if the air handling units are mixed in with IT equipment of at the room edges. The user interaction may be a series of structured questions e.g. "Do you use perimeter cooling?" "Have you established hot and cold aisles"; "Is the airflow contained?", and/or the provision of one or more geometrical representations from which answers to questions can be obtained by analysis. Thus, configuration options can be selected and implemented in an appropriate manner on the simulation model.

The additional database (or section of an integrated database) for obtaining characteristics of data center devices contains information about the equipment in the data center such as precise dimensions and operating characteristics, which can be used to add more detail to the simulation model. Details include sizes, capacities, performance models, location of holes, airflow rates, heat production rates, etc. Such information can be used to set boundary conditions for the simulation. Sources of the information in the DCD-DB 17 include manufacturers or data specification sheets. Examples of equipment or devices about which information may be stored in the DCD-DB 17 include IT equipment, racks, air handlers, cable ducting, perforated tiles, power distribution units (PDUs), blanking panels, etc. The automatic model creation process 13 may be executed in such a way that it uses default information when specific information cannot be found in the DCD-DB 17. Information identifying a piece of equipment may be derivable from a plan or other information provided by the user. Once a piece of equipment has been identified, for example by name or model or by generic type, an appropriate entry can be accessed from the DCD-DB 17 and the simulation model configured accordingly.

The process of creating the simulation model is illustrated in FIG. 3 as comprising four modelling phases: establishing a conceptual model 131, transforming the conceptual model 131 into a grounded model 132, transforming the grounded model 132 into a tailored model 133, and finally transforming the tailored model 133 into a simulation model 14.

A first phase of establishing a conceptual model 131 includes obtaining characterizations including design characterization and overall operating technology characterizations 121 input by the user and used to select configuration options from the information encoded in the DCT-DB 161. The only user input required is the input of the characterizations including design characterization and overall operating technology characterizations 121, and the rest of the processing is automated, for example, a computer is operable to execute the required processing based on instructions.

The conceptual model may be considered to be an abstract model of the data center, coding the design and operating principles and an indication of the likely spaces in the model and expected arrangement of equipment (such as existence or not of rows of IT equipment, cooling equipment locations etc) as well as indications of the main airflow paths. In that sense, it may be that the conceptual model includes configuration options, but these options are not yet implemented on an actual model, and their existence or precise form may be conditional on information not yet input to the process.

The conceptual model may be generated by combining selections through a simple interaction with the user as forms or check lists to obtain characterizations including characterization of the overall design and operational technologies 121.

The conceptual model 131 serves as guidance for the creation of the grounded model 132 in the next phase, detailing features that should be looked for in the information supplied by the user for the next step, in the form of configuration options and logic for selecting and implementing them. Interaction with the user in establishing the conceptual model 131 may be through a series of questions driven by the DCT-DB 161. An example of such an interaction is given in FIG. 4.

The conceptual model establishes the type of the data center infrastructure, the core details about how the air flows through the data center and how the designers intended to move the heat about. These architectural principles are well documented in the codification literature so that the consequences for the simulation model implied by the conceptual model can be stored as configuration options in the configuration options database 16 and the process of transforming the model may include selecting from among the configuration options in the conceptual model and implementing them. Such configuration options encompass such notions as:

Airflow management strategies
  The airflow management strategy may be characterised as, for example, open/partially contained/contained. The airflow management strategy may be used to make assumptions about airflow requirements, delivery methods, and room layout, which are examples of configuration options stored with that characterization in the configuration options database, and the precise selection of configuration options and their implementation may be dependent upon further information to be input to the process.
Equipment placement strategies.
  Equipment placement strategies are characterizations of the arrangement of physical entities influencing airflow in the space being modelled. For example, CRAG units may be characterised as being arrange 'at the perimeter', and server equipment may be characterised as being arranged 'in rows'. Other equipment may be characterised as being at the 'rooftop/building exterior', or 'in cabinets', for example. Such information can be stored in the conceptual model 131, and used to establish the grounded model 132 in accordance with information derived from further characterizations and/or a geometrical representation of the space.
Heat rejection strategies
  Again, a characterization of the heat rejection strategy (chilled water/direct expansion refrigeration system/economization) may be obtained and embedded in the conceptual model along with configuration options obtained from the configuration options database 16.

The second phase is transforming the conceptual model 131 into a grounded model 132 based on a geometrical representation of the data center and other information 101 input by the user (although such a representation and other information could be input by a machine) and used to select configuration options from the DCT-DB 161, the DCOP-DB 162, and the DCD-DB 17. By this phase, the characterizations 121 input in establishing the conceptual model are embedded in the model, so they are available for use in selecting configuration options or implementing configuration options.

Part of the process of transforming the conceptual model 131 into a grounded model 132 may be to extrude the 2-dimensional information to 3 dimensions using knowledge of standard or specific dimensions form the DCD-DB 17.

The grounded model 132 is a specialized version of the conceptual model 131 for the particular data center being modeled. The specialization is achieved by using the configuration options obtained from the database in establishing the conceptual model and applying them to information such as a geometrical representation of the data center and other information obtained from the user. Assumptions codified into the selection of configuration options and the logic applied to how to implement the configuration options may be made in the process of transforming the conceptual model 131 into the grounded model 132. Automated analysis of plans of the data center and querying of the configuration options database 16 may be combined with information from other sources such as the user and the DCD-DB 17 in order to guide the process of generating the grounded model 132. Additional guidance may be provided by the conceptual model which may imply the presence of certain physical entities in the space which cannot be identified on the plan, and are added in a default or best-practice position based on logic stored in the database and associated with a characterization of the data center. For example, the conceptual model 131 may be used to suggest, as configuration options, parts of the 3D space that are not derivable from the plans e.g. under-floor or ceiling plenums, the configuration of the additional spaces (e.g. part of the conceptual model is an indication of where cabling is run—overhead, under-floor etc). Additionally, other conceptual characteristics can be used to infer the existence of barriers to air flow that are not recorded in the plans e.g. "fully contained aisles" imply that there may be a barrier to vertical airflow in, say, the cold aisles and that any gaps in a aisle where there is no equipment marked in the plan will be closed by a barrier. Hot/cold aisles imply that if no perforated tiles are marked in the plans, then they must be placed only in some of the aisles (cold ones). Perimeter cooling implies that any equipment by the room walls is likely to be cooling and not IT and that equipment in the center of the room is IT or power supply and so heat sources.

Overall, the process of transforming a conceptual model 131 into a grounded model 132 is guided by inputs including the conceptual model 131 itself, further data drawn from the DCT-DB 161 and also the DCOP-DB 162, and specific values obtained from the DCD-DB 17 and by analysing and interpreting information obtained from the user such as plans of the space and responses to questions.

Figure 4:
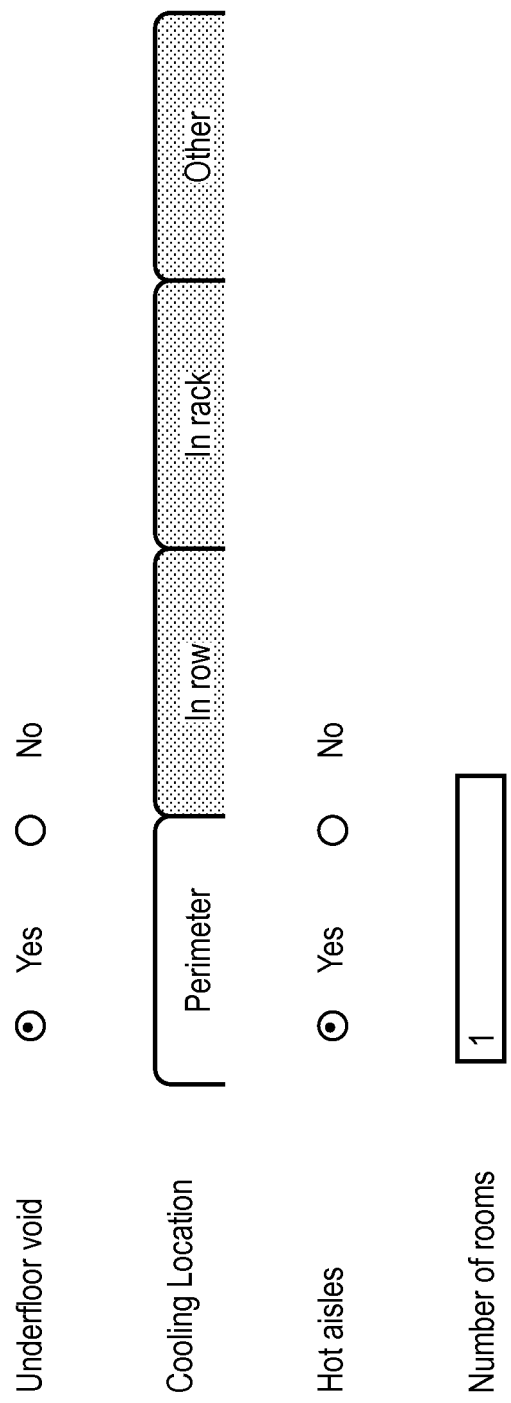
FIG. 4 illustrates an example of user interaction in establishing a conceptual model in a phase of a process embodying the present invention.
Figure 5:
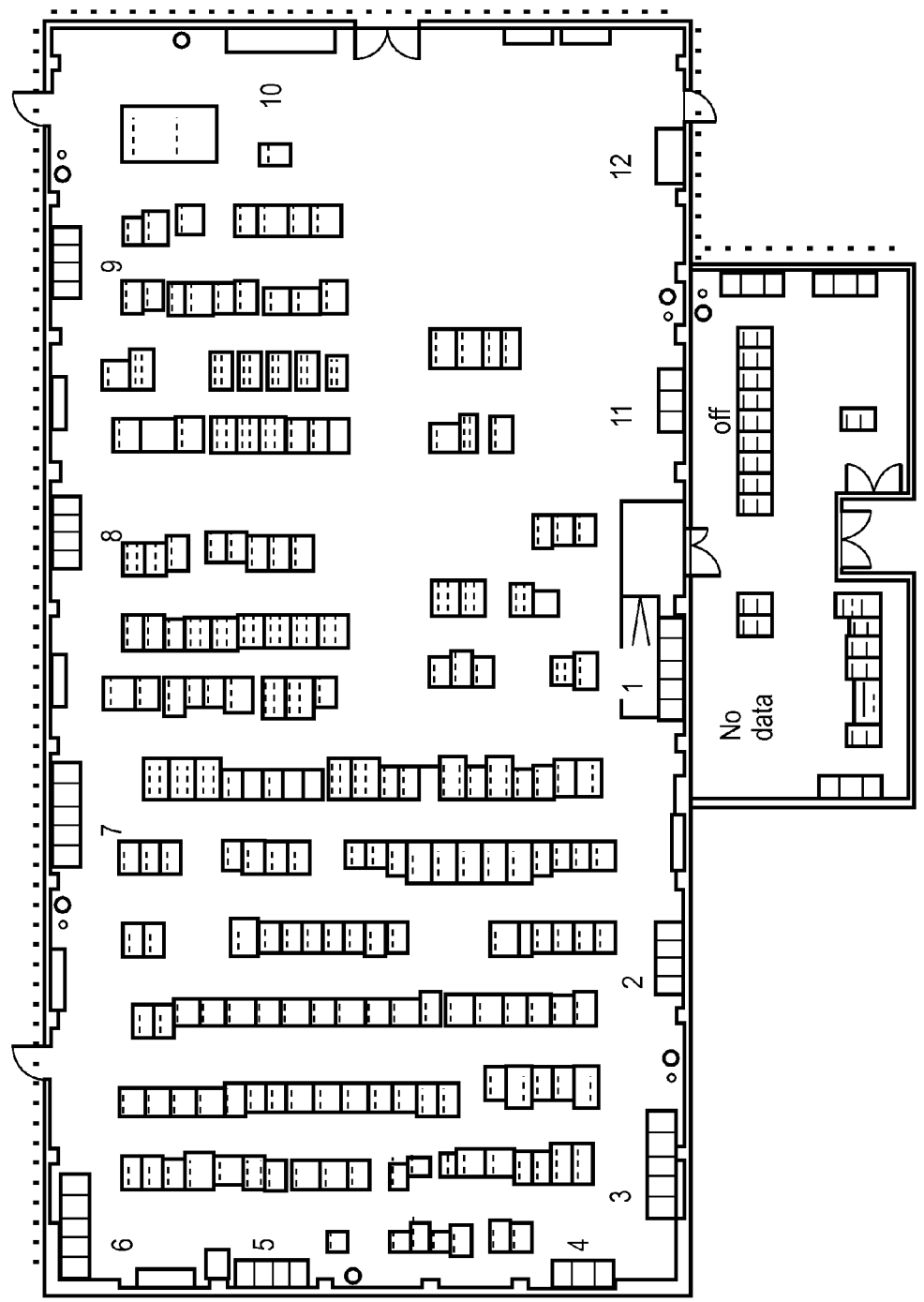
FIG. 5 shows a typical data center plan such as that which might be input by a user in an embodiment of the present invention.
Figure 6:
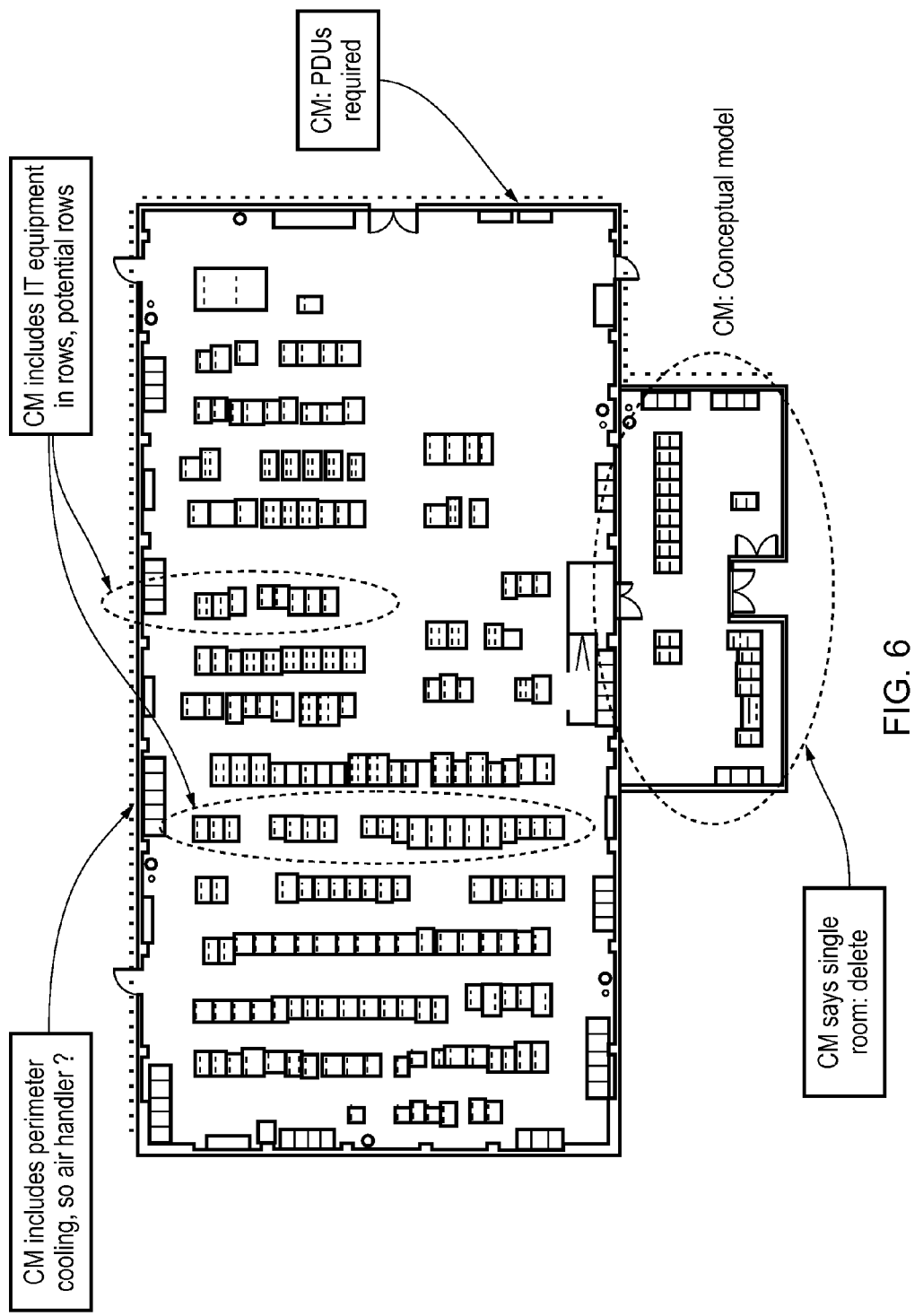
FIG. 6 illustrates how configuration options can be applied to the geometrical representation in embodiments of the present invention.

FIG. 5 shows a typical data center plan such as that which might be input by a user and that needs to be interpreted in the light of the example Conceptual Model created from FIG. 4. Most existing automated model generators would interpret FIG. 5 as a series of objects on the floor, but are unable to attach meaning to these boxes to apply the correct behaviours for a CFD simulation. Model generation on this level is acceptable for generating models for static uses, such as designing rooms, but CFD simulation of data centers requires more dynamic behaviours—in embodiments of the present invention the model generation is able to import behaviours to the objects such as how they generate heat and move air, which influences the CFD simulation results. FIG. 6 illustrates how configuration options can be applied to the geometrical representation in embodiments of the present invention and configurations selected which can be used to configure the model ("CM" in FIG. 6 denotes "Conceptual Model").

As an example, a characterization may be input by a user and stored in the conceptual model as "hot and cold aisles". The configuration options associated with that characterization in the DCT-DB may be to interpret linear formations or partially linear formations on the plan as rows of equipment, and to add airflow patterns so that aisles between the rows of equipment receive only hot or only cold air. Hence, a simple question to the user ("Does the data center have hot and cold aisles?") guides the interpretation of the plan to look for rows and to set the airflow appropriately to make sure that air can enter and leave the rows. The user only requires knowledge of the level that hot and cold rows exist. The configuration options database 16 stores the data required to turn the knowledge of their existence into 3-dimensional features in a simulation model 14 of the data center.

As a further example, consider under floor plenums. Delivering cold air through a plenum or raised floor is a common data center design but is infrequently recorded on plans available to the operators as they have little influence on the under floor space. However, it has a significant influence on the configuration of the CFD model. A simple question to the user ("Is there an under floor plenum?") prompts the automatic generation of a new space in the CFD model by taking the indication that there is an under floor plenum as a characterization of the physical arrangement of physical entities influencing airflow in the database and referring to the configuration options database 16 which stores data necessary to configure the simulation model 14 to include an under floor plenum appropriate for the particular space being modelled. In particular, the input of a characterization that there is an under floor plenum flags the need to add routes for the air to flow from the under floor space to the main space (e.g. perforated tiles) and sets the exits of the cooled air handling units to the under floor space and not the main data center hall.

Figure 7:
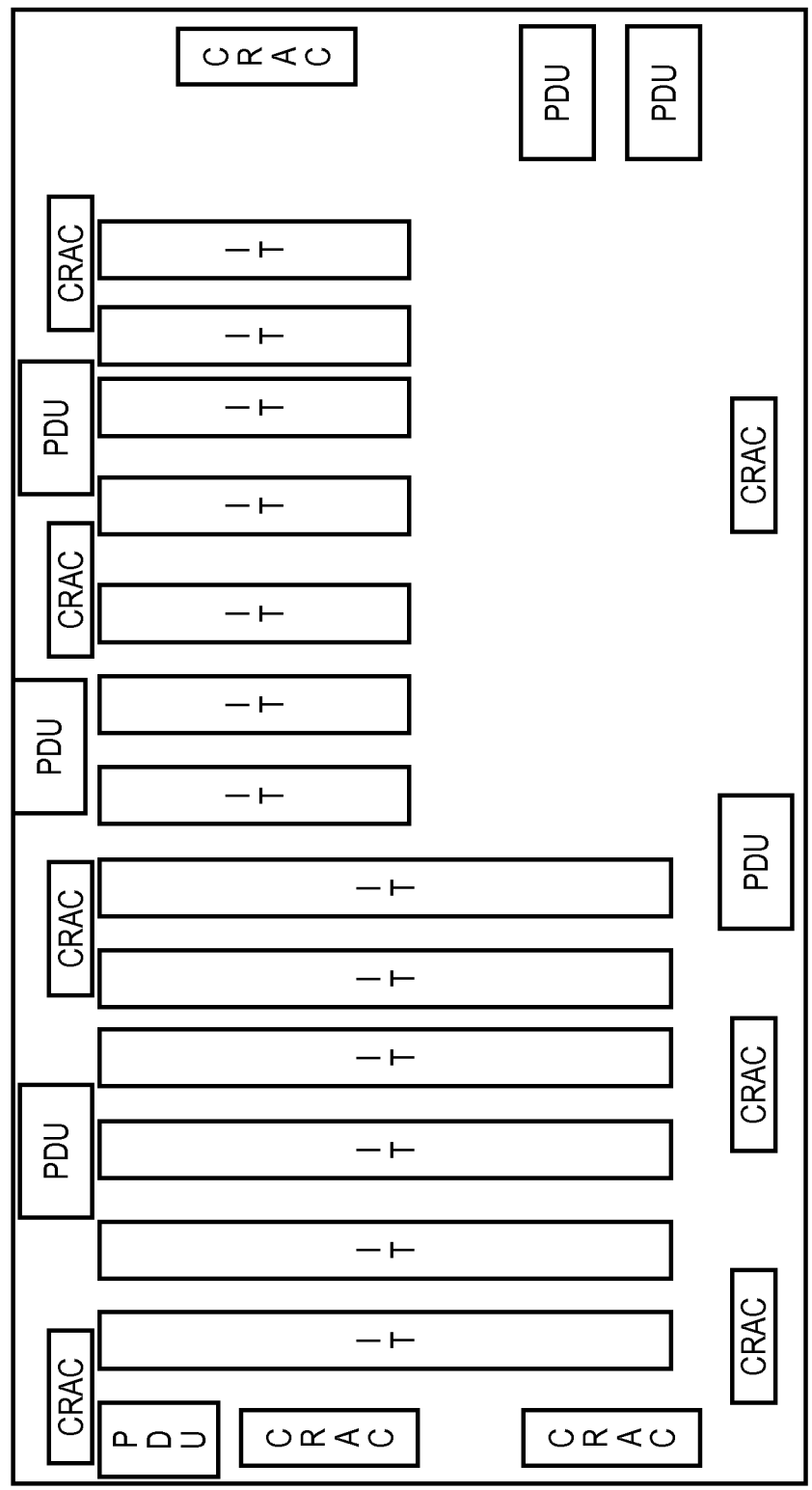
FIG. 7 illustrates an example of a grounded model generated from the floor plan of FIG. 5.

The grounded model may be oriented around object representations, and may contain sufficient detail that the right numbers and capacities of the equipment is included in the model. FIG. 7 illustrates an example of a grounded model generated from the floor plan of FIG. 5 by implementing the configuration options/assumptions demonstrated in FIG. 6.

Once the grounded model 132 has been established, the next phase is transforming the grounded model 132 into the tailored model 133. Characterizations describing how the data center is operated 122 are obtained from a user (although these characterizations could be obtained from a machine) and used to select configuration options from the DCOP-DB 162. In addition, the configuration options implemented in the previous stages, along with the previously entered characterizations, the geometrical representation and other information are embedded in the grounded model 132 and can be used in selecting and implementing configuration options in the process of transforming the grounded model 132 into the tailored model 133.

Furthermore, establishing the tailored model 133 may include a process of presenting a representation of the model to the user, for example as an object-oriented CAD model, in a form in which the user can register required manipulations (modifications to make to the model) so that it more accurately reflects the space being modelled. The representation presented to the user may be a 3-D projection with equipment types marked and with anticipated airflow paths indicated. The process of producing the tailored model 133 includes making the registered modifications, and possibly then presenting a representation of the model to the user again, so that manipulations can be registered and modifications made on an iterative basis.

The tailored model 133 adds more detail to the grounded model 132 and enables the user to correct incorrect assumptions or inferences used in the process to that point.

Finally, once the form of the tailored model has been finalised, processing is performed to transform the tailored model into a simulation model 14. Such a transformation may include transforming a CAD model into a mesh of grid points required for CFD simulations. The mesh is constructed in a careful fashion so that it does not introduce any artefact into the simulation and so that the simulation is numerically stable. Techniques for going from CAD model to mesh-oriented model are established in this field. The simulation model is the final geometric representation that is suitable for input to the CFD simulation program. The transformation from a tailored model 132 to simulation model 14 may include a change of representation from object oriented (CAD) to mesh oriented including modification to the model to ensure accurate and stable CFD simulations and the inclusion of information related to these modifications (e.g. nature of joins between objects, permeability of regions to air flow).

In embodiments of the present invention, the generation of the simulation model 14 may include not only producing a 3-dimensional representation of a space, but including in that model information relating to the physical processes that move air and heat around the space. The process of generating the simulation model 14 may include a process of setting drivers of the physical processes that move air and heat around the data center. This process may be included as part of the transformation of the grounded model to the tailored model, as part of the transformation of the tailored model to the simulation model. Examples of drivers that may be set include the heat generated by the various pieces of IT equipment such as servers, the amount of heat removed by the cooling processes, the speed with which air is moved about by the fans in the IT and cooling equipment and how easily air flows through the data center. The level of detail and format of information required for a CFD simulation is specialized. However, in embodiments of the present invention, the configuration options database 16 can be queried to obtain instructions for configuring the simulation model 14 based on characterizations of the data center provided by a user. For example, a user may indicate that aperture brushes have been installed. This characterization is stored in the database 16 with an instruction (as a configuration option) that if there are any gaps between the raised floor and the IT equipment, they should be sealed in the simulation model 14. Alternatively, if the user has stated that aperture brushes have not been installed, the simulation model 14 will be configured to allow a degree of airflow between the raised floor and the bottom of the equipment.

The intent of this phase (setting drivers of the physical processes) is to set values for the processes that drive the CFD simulation: the flow of heat and air across the boundaries of the model. These values are consequences of the operating practices of the data center, which have been input to the process of model generation by the user as characterizations of operating practices, and so this process is guided by codified data in the DCOP-DB 162 and user responses driven by this DB.

Figure 8:
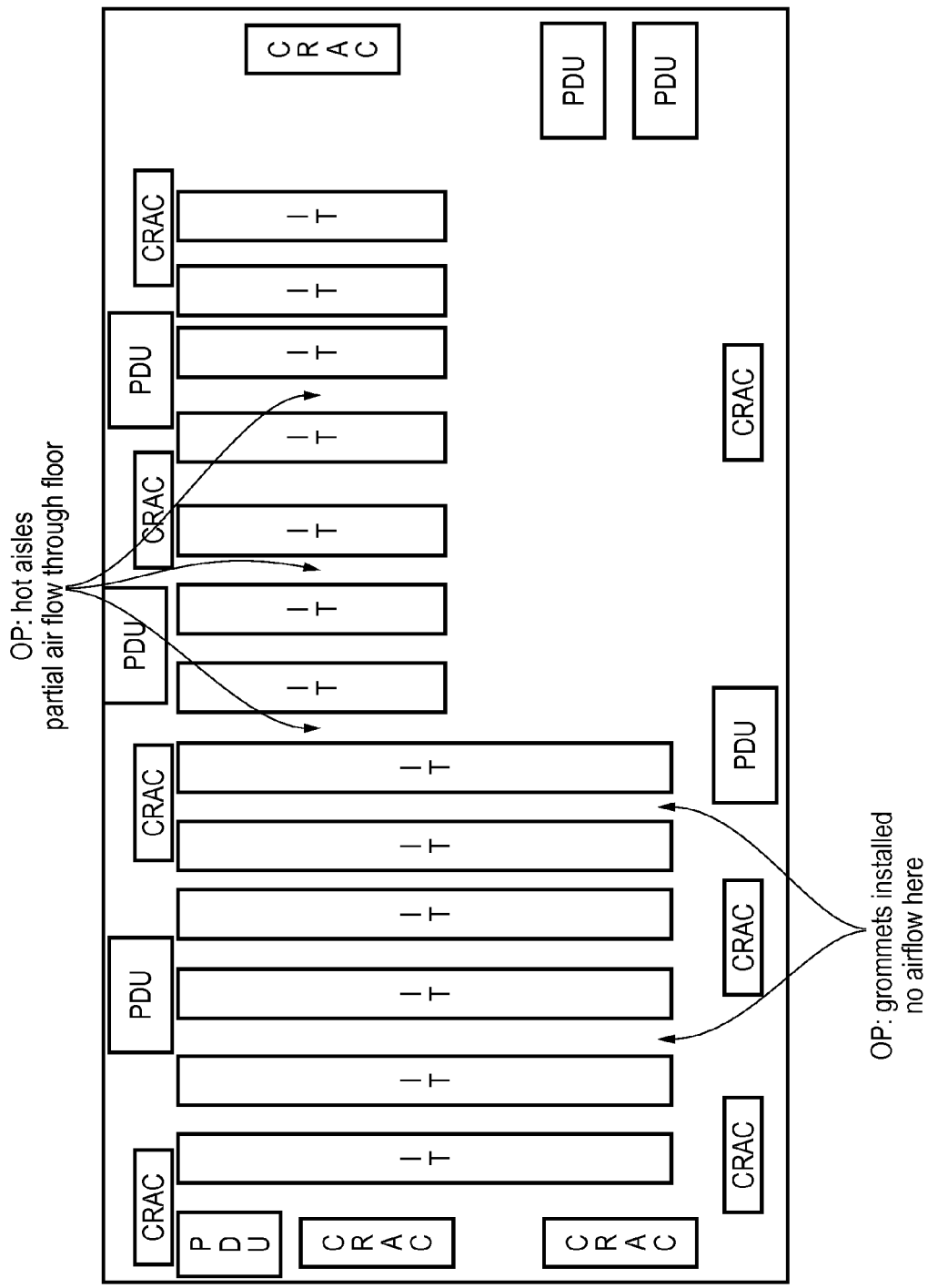
FIG. 8 illustrates how the grounded model of FIG. 7 may be embellished by information about operating practices.

FIG. 8 illustrates how the grounded model of FIG. 7 may be embellished by information about operating practices in a process of setting drivers of the physical processes. For example, in FIG. 8, the characterization of operating practices is that there are hot aisles. The configuration option is to allow partial air flow through the floor. Another characterization of operating practices is that grommets are installed. The configuration option is to inhibit airflow at particular aisle ends if grommits are installed.

In any of the above aspects, the various features may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

The invention claimed is:

1. A computer-implemented method of generating a simulation model of a space, the simulation model being a dimensional geometrical representation of the space in a format appropriate for computational fluid dynamic analysis, the method being implemented by a processor, and comprising steps of:
   obtaining a two-dimensional geometrical representation of the space;
   obtaining, as an input from a user, a characterization of one of the operation and arrangement of physical entities influencing airflow in the space, from among a predetermined set of characterization;
   generating the simulation model of the space based on the two-dimensional geometrical representation, wherein said generating includes:
   obtaining, from a database of configuration options, a set of configuration options stored in association with the obtained characterization of the operation of physical entities influencing airflow in the space, and a set of configuration options stored in association with the obtained characterization of the operation of physical entities influencing airflow in the space, wherein each configuration option includes an element for potential inclusion in the simulation model as an interpretation of content in the two-dimensional geometrical representation of the space, and logic for determining whether or not to interpret content in the two-dimensional geometrical representation of the space as the element;
   configuring the simulation model by selecting configuration options from the configured options obtained from the database, by applying the logic of each obtained configuration option to content in the two-dimensional representation of the space.

2. A computer-implemented method according to claim 1, wherein:
   the configuration options include elements to include in the simulation model, and one of the form and position of the elements is determined by the content of the geometrical representation.

3. A computer-implemented method according to claim 1, wherein the configuration options include interpretations of the content of the geometrical representation, and selecting configuration options includes selecting an interpretation of the content of the geometrical representation based on shape and position of said content.

4. A computer-implemented method according to claim 1, wherein the configuration options are one of assumptions, presumptions, and inferences about the space made to obtain a representation of the space in sufficient detail for the simulation model to be generated in an appropriate format, based on the geometrical representation.

5. A computer-implemented method according to claim 1, wherein
the characterization includes one of indications and descriptions of one of a following aspect of the space:
a layout of equipment in the space;
a positioning of cooling equipment;
an operating principle of types of equipment in the space;
an airflow management strategy; and
a heat exchange mechanism employed by cooling equipment.

6. A computer-implemented method according to claim 1, wherein the generating further includes, following the configuring, a manipulation process including:
outputting an intermediate representation of the space implementing a selected configuration options in a form in which manipulations can be registered;
obtaining registered manipulations; and
modifying the intermediate representation of the space in accordance with the registered manipulations.

7. A computer-implemented method according to claim 6, wherein the generating includes:
generating a three-dimensional object-oriented representation of the space; and
converting the three dimensional object-oriented representation of the space into the simulation model.

8. A computer-implemented method according to claim 7, wherein the method is computer-implemented.

9. A computer-implemented method according to claim 8, wherein one of:
obtaining the characterization;
obtaining the geometrical representation; and
obtaining registered manipulations;
are obtained by receiving indications of inputs from a user of the computer implementing the method.

10. A computer-implemented method according to claim 1, wherein the geometrical representation includes operating information of physical entities influencing airflow within the space.

11. A non-transitory storage medium storing a simulation model generation program which, when executed by a computer, causes the computer to perform a method according to claim 1.

12. A system for generating a simulation model of a space, the system comprising:
a computer configured to perform the method according to claim 1; and
a data storage unit storing the database.

13. A simulation model generation apparatus for generating a simulation model of a space, the simulation model being a three-dimensional geometrical representation of the space in a format appropriate for computational fluid dynamic analysis; the simulation model generator comprising a memory and a processor, the memory storing processing instructions which when executed by the processor, cause the processor to function as:
a geometrical representation acquisition unit operable to obtain a two-dimensional geometrical representation of the space;
a characterization acquisition unit operable to obtain, as an input from a user, a characterization of the operation and arrangement of physical entities influencing airflow in the space, from among a predetermined set of characterizations;
a generator operable to generate the simulation model of the space based on the two-dimensional geometrical representation, wherein said generating includes:
obtaining, from a database of configuration options, a set of configuration options stored in association with the obtained characterization of the operation of physical entities influencing airflow in the space, and a set of configuration options stored in association with the obtained characterization of the operation of physical entities influencing airflow in the space, wherein each configuration option includes an element for potential inclusion in the simulation model as an interpretation of content in the two-dimensional geometrical representation of the space, and logic for determining whether or not to interpret content in the two-dimensional geometrical representation of the space as the element;
configuring the simulation model by selecting configuration options from the configuration options obtained from the database, by applying the logic of each obtained configuration option to content in the two-dimensional representation of the space.

* * * * *